(12) United States Patent
Takagi (10) Patent No.: US 7,551,706 B2
(45) Date of Patent: Jun. 23, 2009

(54) COUNTER DEVICE AND COUNTING METHOD

(75) Inventor: Seigo Takagi, Osaka (JP)

(73) Assignee: Kyocera Mita Corporation, Chuo-Ku, Osaka-Shi, Osaka (JP)

( * ) Notice: Subject to any disclaimer, the term of this patent is extended or adjusted under 35 U.S.C. 154(b) by 382 days.

(21) Appl. No.: 11/289,367

(22) Filed: Nov. 30, 2005

(65) Prior Publication Data

US 2006/0133560 A1 Jun. 22, 2006

(30) Foreign Application Priority Data

Dec. 3, 2004 (JP) ............................. 2004-351590
Dec. 3, 2004 (JP) ............................. 2004-351591

(51) Int. Cl.
*H03K 21/00* (2006.01)
(52) U.S. Cl. .......................................... 377/26; 377/33
(58) Field of Classification Search .................. 377/26, 377/28, 33, 34
See application file for complete search history.

(56) References Cited

U.S. PATENT DOCUMENTS 5,450,460 A * 9/1995 Stodieck ....................... 377/44

| 6,707,874 B2 * | 3/2004 | Murphy ..................... 377/33 |
| 6,792,065 B2 * | 9/2004 | Maletsky ................... 377/34 |
| 2004/0107377 A1 * | 6/2004 | Wells ....................... 713/500 |

FOREIGN PATENT DOCUMENTS

| JP | 01-159894 | 6/1989 |
| JP | 04-143998 | 5/1992 |
| JP | 04-372224 | 12/1992 |
| JP | 06-162786 | 6/1994 |
| JP | 06-252745 | 9/1994 |
| JP | 11-110983 | 4/1999 |
| JP | 2001-118391 | 4/2001 |
| JP | 2002-150781 | 5/2002 |
| JP | 2004-170811 | 6/2004 |

* cited by examiner

*Primary Examiner*—Tuan Lam
(74) *Attorney, Agent, or Firm*—Squire, Sanders & Dempsey L.L.P.

(57) ABSTRACT

A counter device includes: a rewritable counter having a non-volatile memory which requires sector erasure to once turn all data in a sector into high data, prior to changing low data into high data in respective bits; and a control section updating a counter value of the rewritable count by writing in and reading out the data with respect to the rewritable counter using a complement of 1, and thereby controlling writing in and reading out the data of the rewritable counter.

2 Claims, 9 Drawing Sheets

Prior Art

FIG. 8

Prior Art

FIG. 9

Prior Art

COUNTER DEVICE AND COUNTING METHOD

BACKGROUND OF THE INVENTION

1. Field of the Invention

The present invention relates to a counter device, and a counting method using a non-volatile memory.

Priority is claimed on Japanese Patent Application No. 2004-351590, filed Dec. 3, 2004, and Japanese Patent Application No. 2004-351591, filed Dec. 3, 2004, the contents of which are incorporated herein by reference.

2. Description of Related Art

A printer and a copier control a large number of counters by a non-volatile memory (flash memory: registered trademark). The counter counts the number of printed sheets and is also used for accounting purpose. Therefore a high reliability is required. The non-volatile memory the reliability is described as the bits are used more frequently. Therefore, the manufacturer sets a guaranteed number of writings. If the number of writings exceeds the set number, the reliability of the non-volatile memory is remarkably decreased. In this case, it is not guaranteed by the manufacturer.

In the non-volatile memory, due to the device property thereof, the counter value can not be overwritten in the same area in the non-volatile memory each time the counter is updated. That is, in the non-volatile memory, the memory region is divided into units called sectors, and at the time of updating the data, in order to turn ON the bit that has been OFF, it is necessary to once perform sector erasure which is to turn ON the bits (0xff: hexadecimal number "ff") of all the data in the sector, and then to write in the new data.

Figure 7:
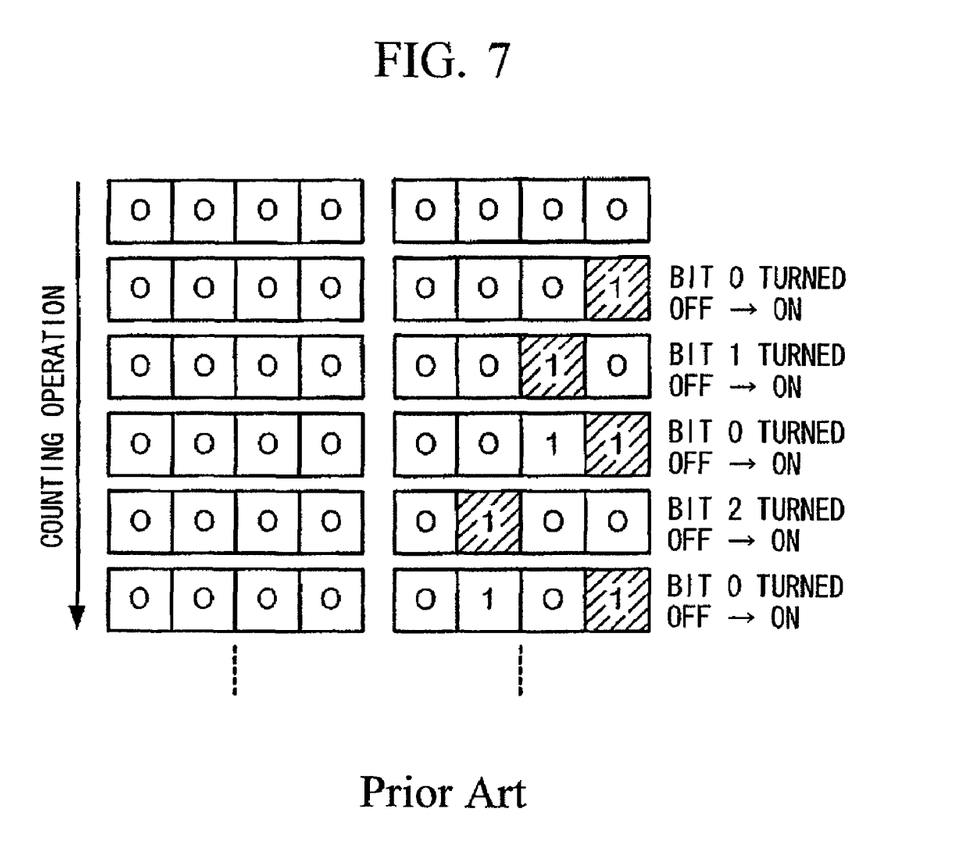
FIG. 7 is a schematic diagram showing the operation of a conventional typical counter.

Generally, as a counter, as shown in FIG. 7, "0" is previously written in all bits, so that the bits are counted up from the lower bit one by one at the time of counting. As described above, in the non-volatile memory, in order to turn ON the bit that has been OFF, it is necessary to once perform the sector erasure which is to turn ON the bits (0xff) of all the data in the sector.

Figure 8:
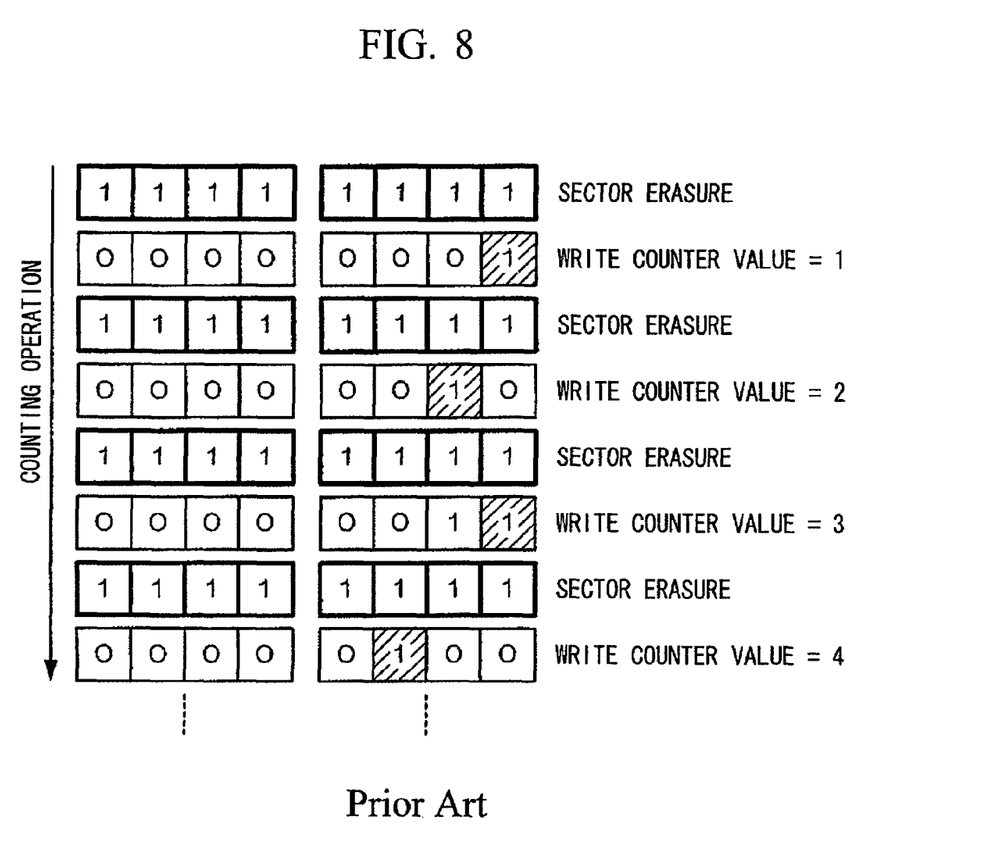
FIG. 8 is a schematic diagram showing the frequency of sector erasures in the conventional typical counter.

Consequently, as shown in FIG. 8, in this case, each time the counter value is updated, the sector erasure is performed, generating writings having the same number of bits of the counter. Therefore, as described above, the reliability of the non-volatile memory is rapidly decreased. In order to increase the reliability of the counter value, the number of rewritings is desirably as low as possible.

Figure 9:
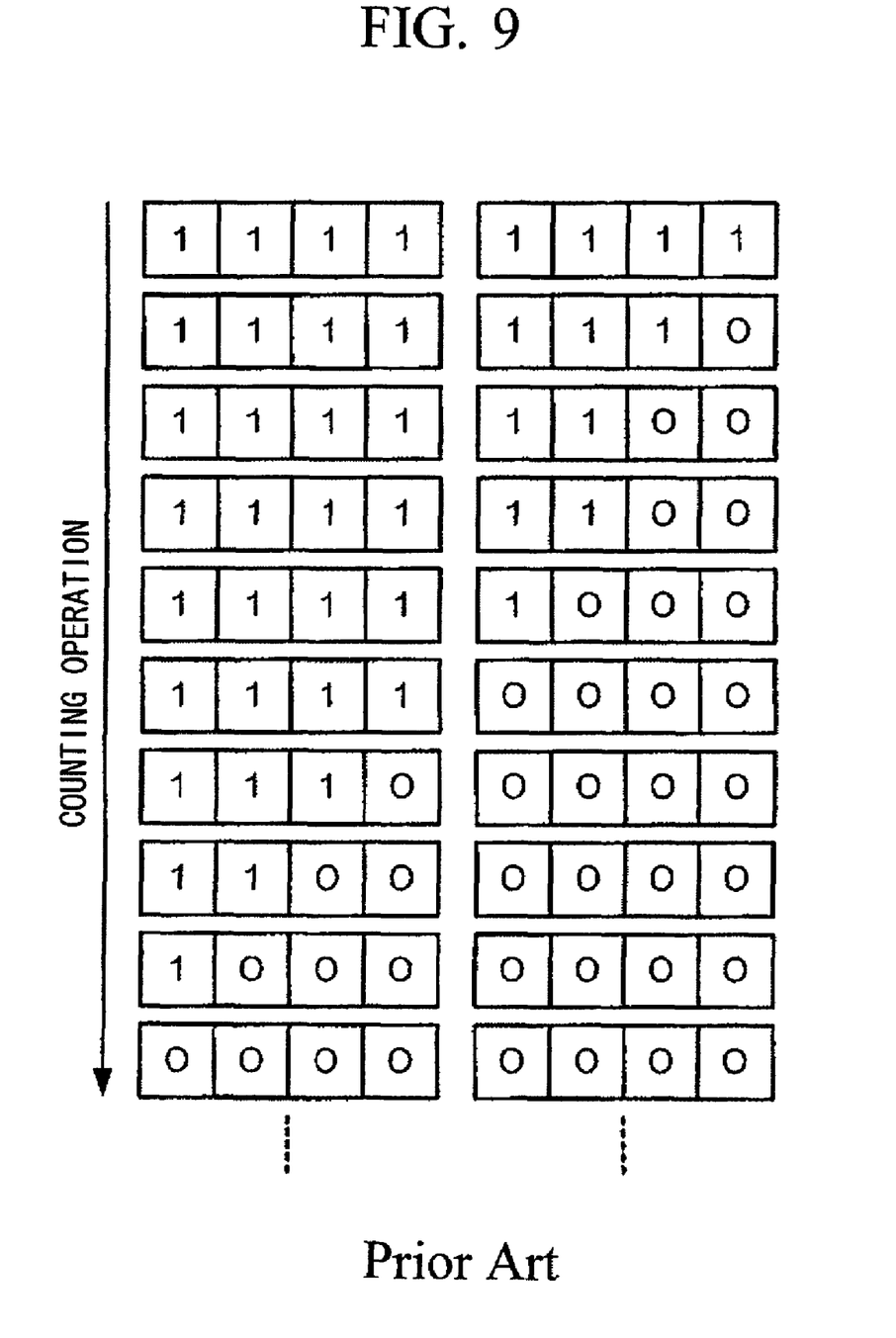
FIG. 9 is a schematic diagram showing the operation of a conventional counter in which the frequency of sector erasures is decreased.

According to Japanese Unexamined Patent Application, First Publication No. 2001-118391, and Japanese Unexamined Patent Application, First Publication No. H11-110983, several techniques for decreasing the number of sector erasures at the time of updating the counter value have been proposed. In the conventional techniques, as shown in FIG. 9, "1" is previously written in all the bits of the counter, so that the counting is performed by bit OFF. Therefore, the bit "1" is changed to the bit "0". By turning the bit from ON to OFF, the number of bytes of the counter can be counted without the sector erasure.

However, in the prior art described above, since number of bits equals maximum counter value, the same number of bits as that of the maximum counter value is required. For example, if several hundred thousand units are counted, several hundred thousand bits are required, causing a problem in that, in reality, installation is difficult, considering the memory capacity and the cost.

SUMMARY OF THE INVENTION

The present invention takes such problems into consideration, with an object of providing a counter device which can reduce the device load, and increase the reliability of the counter value, without increasing the memory capacity nor the cost, and a counting method thereof.

In order to solve the above problem, the invention provides a counter device includes a rewritable counter having a non-volatile memory which requires sector erasure to once turn all data in a sector into high data, prior to changing low data into high data in respective bits; and a control section updating a counter value of the rewritable counter by writing in and reading out the data with respect to the rewritable counter using a complement of 1, and thereby controlling writing in and reading out the data of the rewritable counter.

In order to solve the above problem, the invention provides a counting method includes controlling writing in and reading out the data of a rewritable counter having a non-volatile memory which requires sector erasure to once turn all data in a sector into high data, prior to changing low data into high data in respective bits; and updating a counter value of the writable counter by writing in and reading out of the data with respect to the writable counter using a complement of 1.

According to the invention, by the control section, writing in and reading out of the data are performed based on the complement of 1 so as to update the counter value, with respect to a rewritable counter comprising a non-volatile memory which requires sector erasure to turn all data in a sector into high data once, prior to changing low data into high data in respective bits. Consequently, since the number of sector erasures is reduced by counting based on the complement of 1, an advantage is obtained in that the device load can be reduced, and the reliability of the counter value can be increased, without increasing the memory capacity nor the cost.

In order to solve the above problem, the invention provides a counter device includes a rewritable counter having a non-volatile memory which requires sector erase to once turn all data in a sector into high data, prior to changing low data into high data in respective bits; a lower counter having a first number of bits in the rewritable counter, and counting a first counter value; a upper counter having a second number of bits in the rewritable counter, and counting a second counter value; and a control section updating the first counter value of the lower counter by turning a bit from high to low by one bit increment, updating the second counter value of the upper counter each time the first counter value by the lower counter comes around, and thereby controlling writing in and reading out the data of the rewritable counter.

Moreover, In the above aspect of the invention, it is preferable that the control section resets all bits of the lower counter to high when all the bits of the lower counter are turned to OFF.

In order to solve the above problem, the invention provides a counting method includes controlling writing in and reading out the data of a rewritable counter having a non-volatile memory which requires sector erasure to once turn all data in a sector into high data, prior to changing low data into high data in respective bits; setting a lower counter having a first number of bits in the rewritable counter, and counting a first counter value; setting a upper counter having a second number of bits in the rewritable counter, and counting a second counter value; updating the first counter value of the lower counter by turning a bit from high to low by one bit increment; and updating the second counter value of the upper counter each time the first counter value by the lower counter comes around.

Moreover, In the above aspect of the invention, it is preferable that resetting all bits of the lower counter to high when all the bits of the lower counter are turned to OFF.

According to the invention, the control section turns a bit from high to low by one bit units so as to update the first counter value of the lower counter, and updates the second counter value of the upper counter each time the first counter value by the lower counter comes around. Consequently, an advantage is obtained in that the device load can be reduced, and the reliability of the counter value can be increased, without increasing the memory capacity nor the cost.

Moreover, according to the invention, the control section resets all bits of the lower counter to high, when all the bits of the lower counter are turned to OFF. Consequently, counting of the full guaranteed number of writings can be performed in a flash memory with a small memory capacity, and an advantage can be obtained in that the device load can be reduced, and the reliability of the counter value increased, without increasing the memory capacity nor the cost.

DETAILED DESCRIPTION OF THE INVENTION

Hereunder is a description of embodiment of the invention with reference to the drawings.

Figure 1:
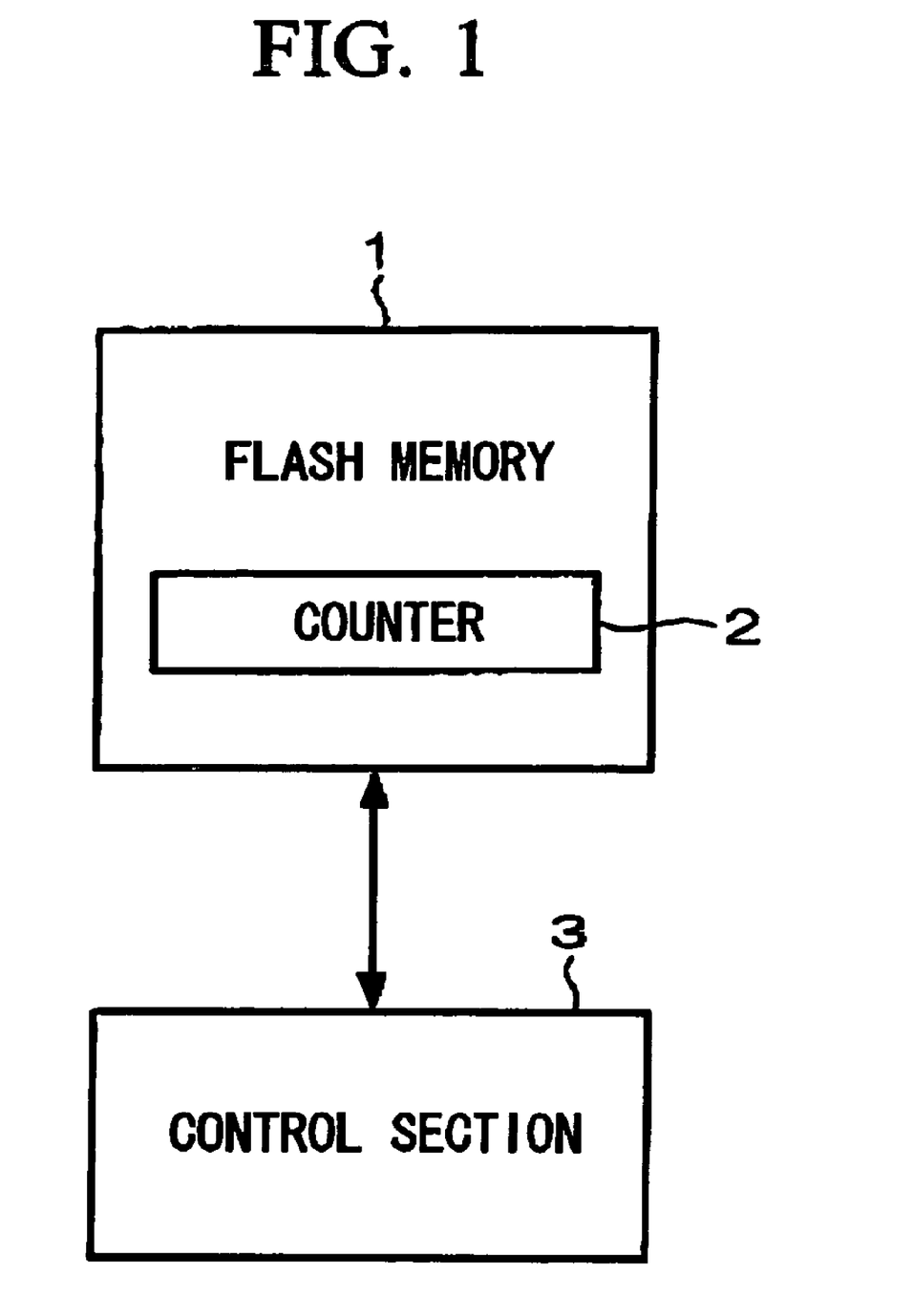
FIG. 1 is a block diagram showing a counter device according to first embodiment of this invention

FIG. 1 is a block diagram showing a counter device of first embodiment of the invention. A flash memory 1 is a non-volatile memory, and has a counter 2. The counter 2 is configured by a predetermined number of bits, and counts the accumulated number of rewritings. A control section 3 controls the writing in and reading out the data of the counter 2. In order to simplify the description, the number of bits of the counter 2 is set to 8 bits (1 byte) in the first embodiment. However the number of bits is not listed to the above bits, and a necessary number of bits may be appropriately maintained according to the maximum counter value.

Figure 2:
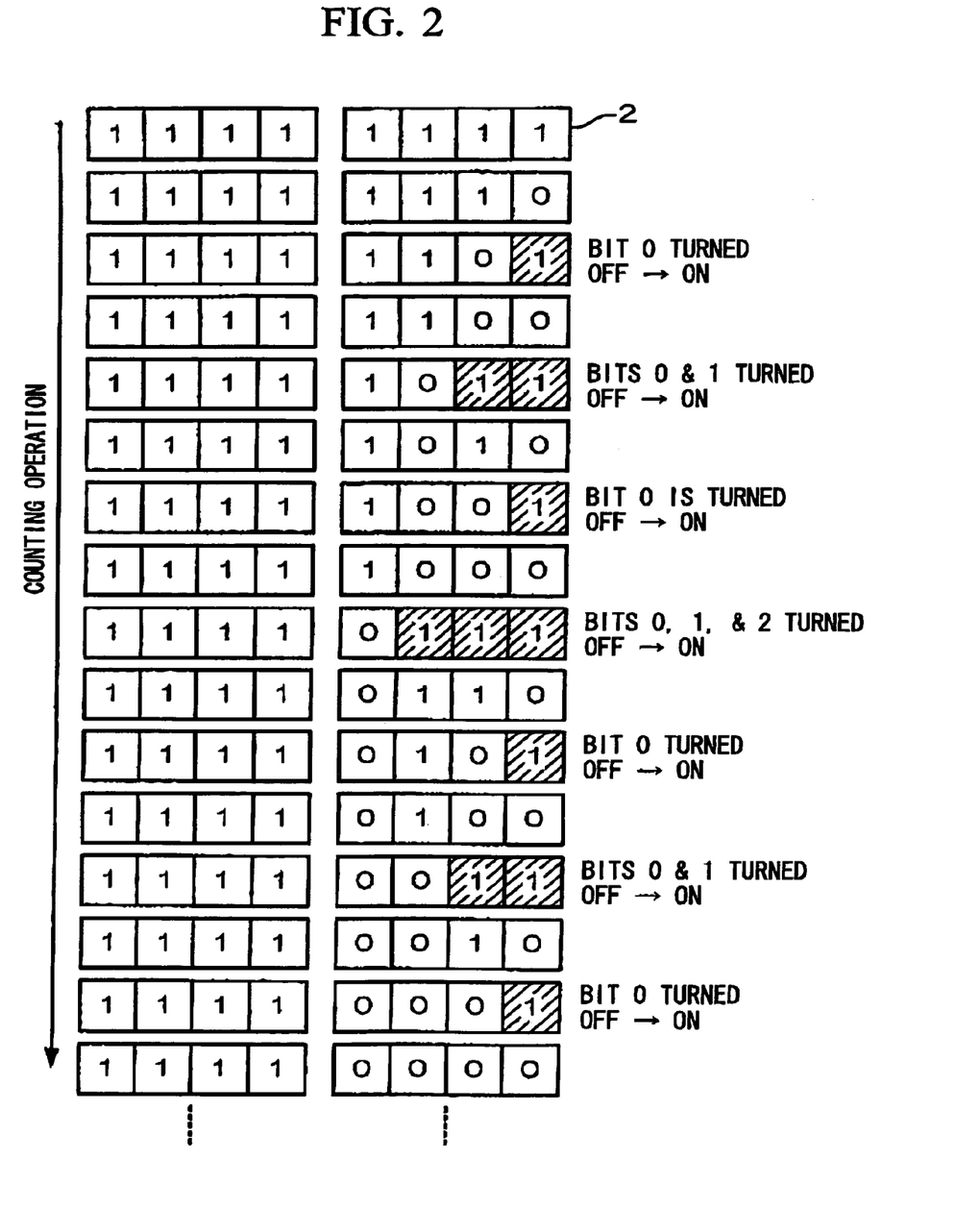
FIG. 2 is a schematic diagram showing the operation of the counter device according to the first embodiment.

Next, FIG. 2 is a schematic diagram showing the operation of the counter device. In the first embodiment, the counter value is controlled as a complement of 1. Firstly, as an initial setting, all bits of the counter 2 are set to "1" (as shown a top of bit string "1111 1111" in FIG. 2). After the initial setting, actual counting is performed. That is, the counting operation is performed with respect to the complement of 1. FIG. 2 shows the sate transition of the counter 2 when the counter value is changed from 0 to 15 (from top to bottom). As shown in FIG. 2, a right end value of each bit string, become bit "0", bit "1", bit "0", . . . , in order from the top of bit string to the bottom bit string. By increasing the count, the bit is turned from OFF to ON (from bit "0" to bit "1") every other time (as shown hatched part in FIG. 2).

Figure 3:
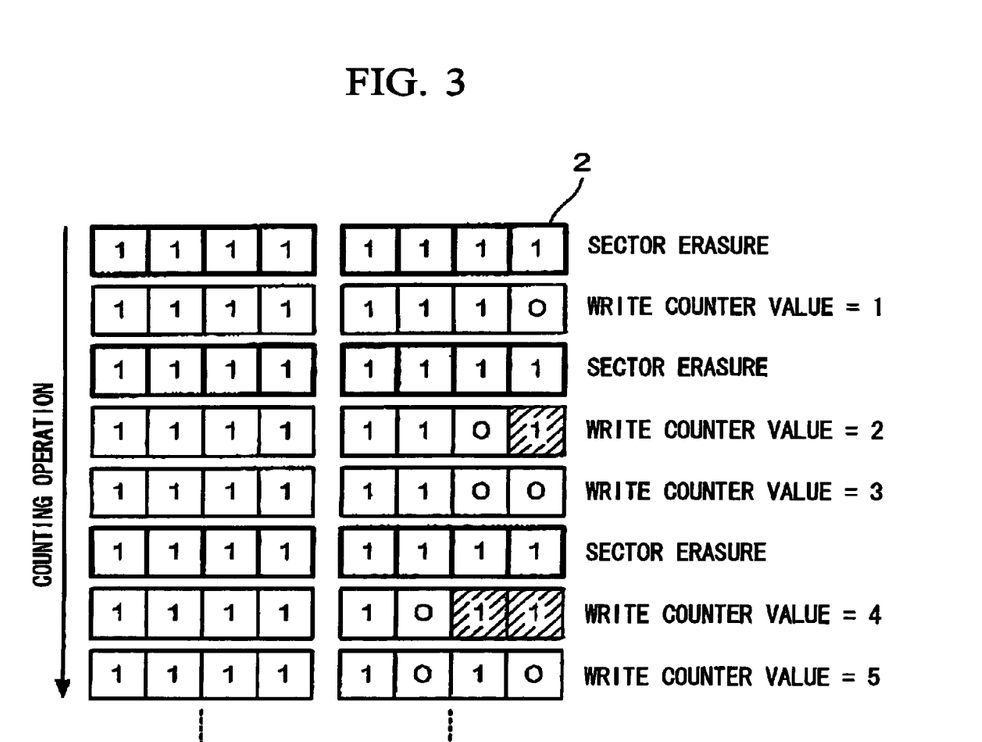
FIG. 3 is a schematic diagram showing the frequency of sector erasures in the counter device according to the first embodiment.

Here, FIG. 3 is a schematic diagram showing the frequency of sector erasures in the counter device according to the first embodiment. As described above, in the flash memory 1, when the bit is turned from OFF to ON (from bit "0" to bit "1"), sector erasure is generated. That is, in the first embodiment, as shown in FIG. 3, at every other time, sector erasure is generated (as shown box part with bold line in FIG. 3). This means that the number of sector erasures is reduced to half, compared to a conventional typical counter. Moreover, comparing the first embodiment with the above Patent Documents (Japanese Unexamined Patent Application, First Publication No. 2001-118391, and Japanese Unexamined Patent Application, First Publication No. H11-110983), since counting is not performed one bit by one bit in the first embodiment, then assuming that the prepared number of bits is "n", only $2^n$ need be counted, and an increase in the memory capacity can be suppressed.

According to the first embodiment, since the counter value can be changed simply by turning the bit OFF (from "1" to "0") at every other time, the number of rewritings of the device by updating the counter can be reduced to half compared to a conventional counter. That is, by a simple modification of software, the device load can be suppressed by half, and the reliability of the counter value can be increased.

Next, a description is second embodiment of the invention with reference to the drawings.

Figure 4:
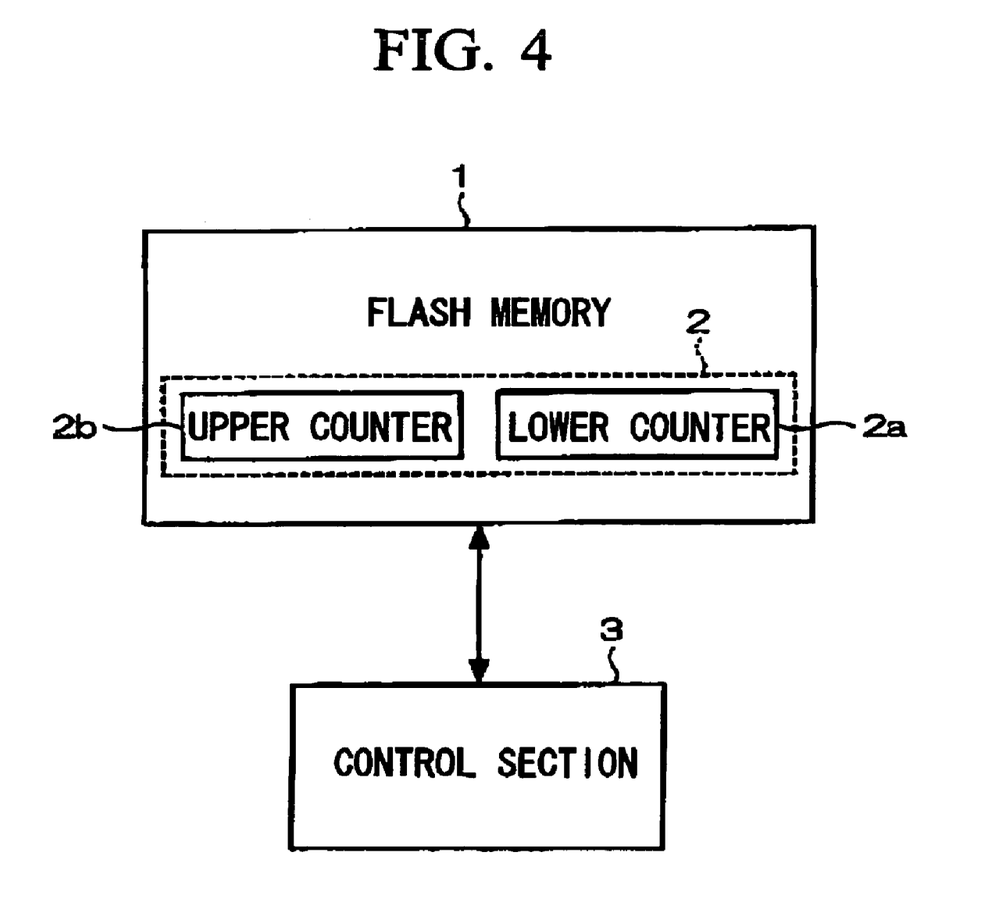
FIG. 4 is a block diagram showing a counter device according to second embodiment of this invention.

FIG. 4 is a block diagram showing a counter device of second embodiment of the invention. A flash memory 1 is a non-volatile memory, and has a counter 2. The counter 2 is configured by a predetermined number of bits, and counts the accumulated number of rewritings. A control section 3 controls the writing in and reading out the data of the counter 2. Similarly to a conventional counter, the counter 2 includes, a lower counter 2a which makes one count by turning the bit from ON ("1") to OFF ("0") for each one bit unit, and an upper counter 2b which counts the number of resettings each time the lower counter 2a is reset, by a general counting method (as show in FIG. 4). Hereunder, in order to simplify the description, the lower counter 2a is set to 32 bytes (1 byte=8 bits, total 256 bits), and the upper counter 2b is set to 1 byte (8 bits). However, the number of bits is not limited to the above bits, and a necessary number of bits may be appropriately maintained according to the maximum counter value.

Figure 5:
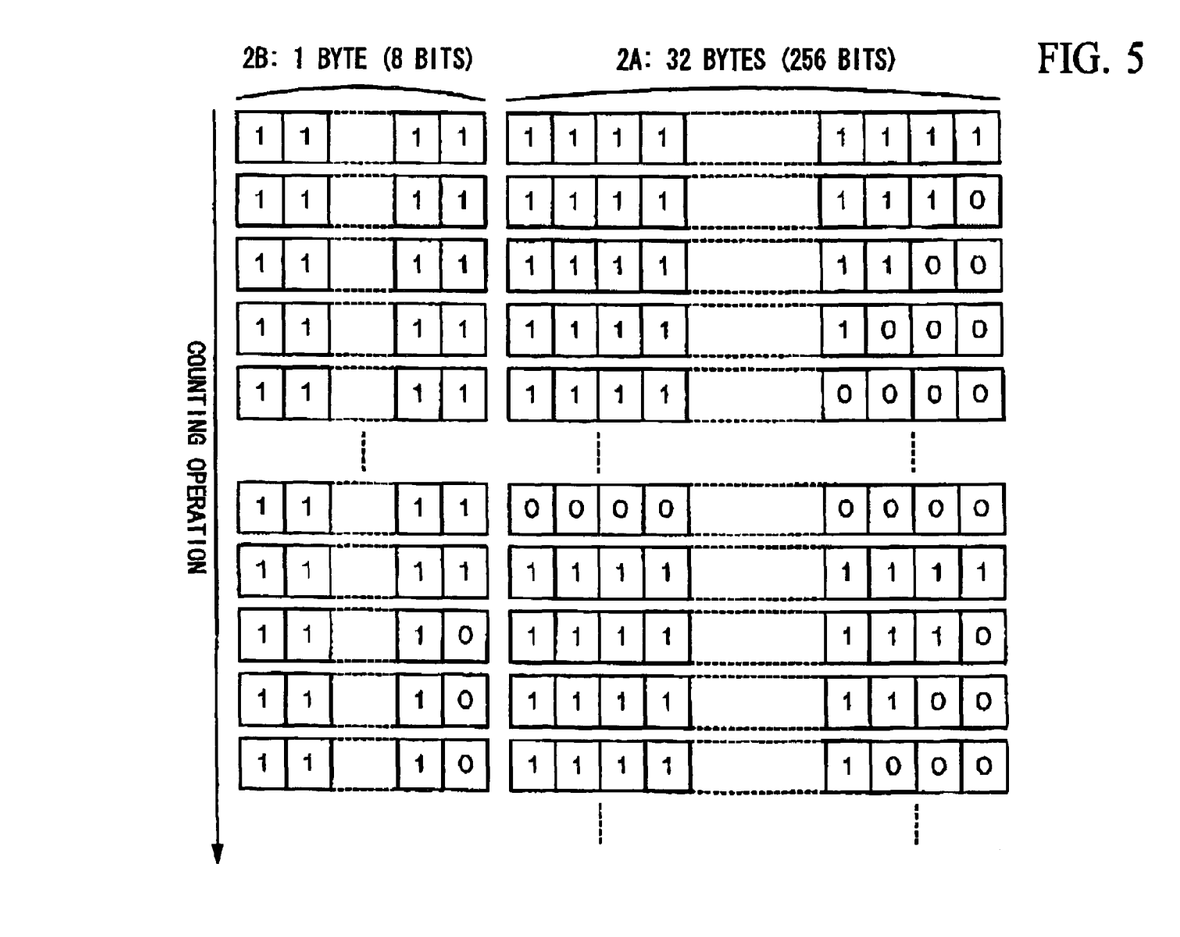
FIG. 5 is a schematic diagram showing the operation of the counter device according to the second embodiment.

Next, FIG. 5 is a schematic diagram describing the operation of the counter device. In the second embodiment, similarly to the conventional counter shown in the above Patent Documents (Japanese Unexamined Patent Application, First Publication No. 2001-118391, and Japanese Unexamined Patent Application, First Publication No. H11-110983), "1" is previously written in all bits in the lower counter 2a, so that the counting is performed by bit OFF (from bit "1" to bit "0"). By turning the bit from ON to OFF, "256" can be counted by 32 bytes without sector erasure. Then, after all bits become "0", all the bits are reset to "1", and the above counting operation is repeated. In the counting operation, when all the bits of the lower counter 2a have been reset from "0" to "1", the upper counter 2b is incremented from the lower bit one by one, and the number of resettings is counted. Consequently, in the counter 2, multiplying $2^8$ and 256 equals 65536 can be counted.

Figure 6:
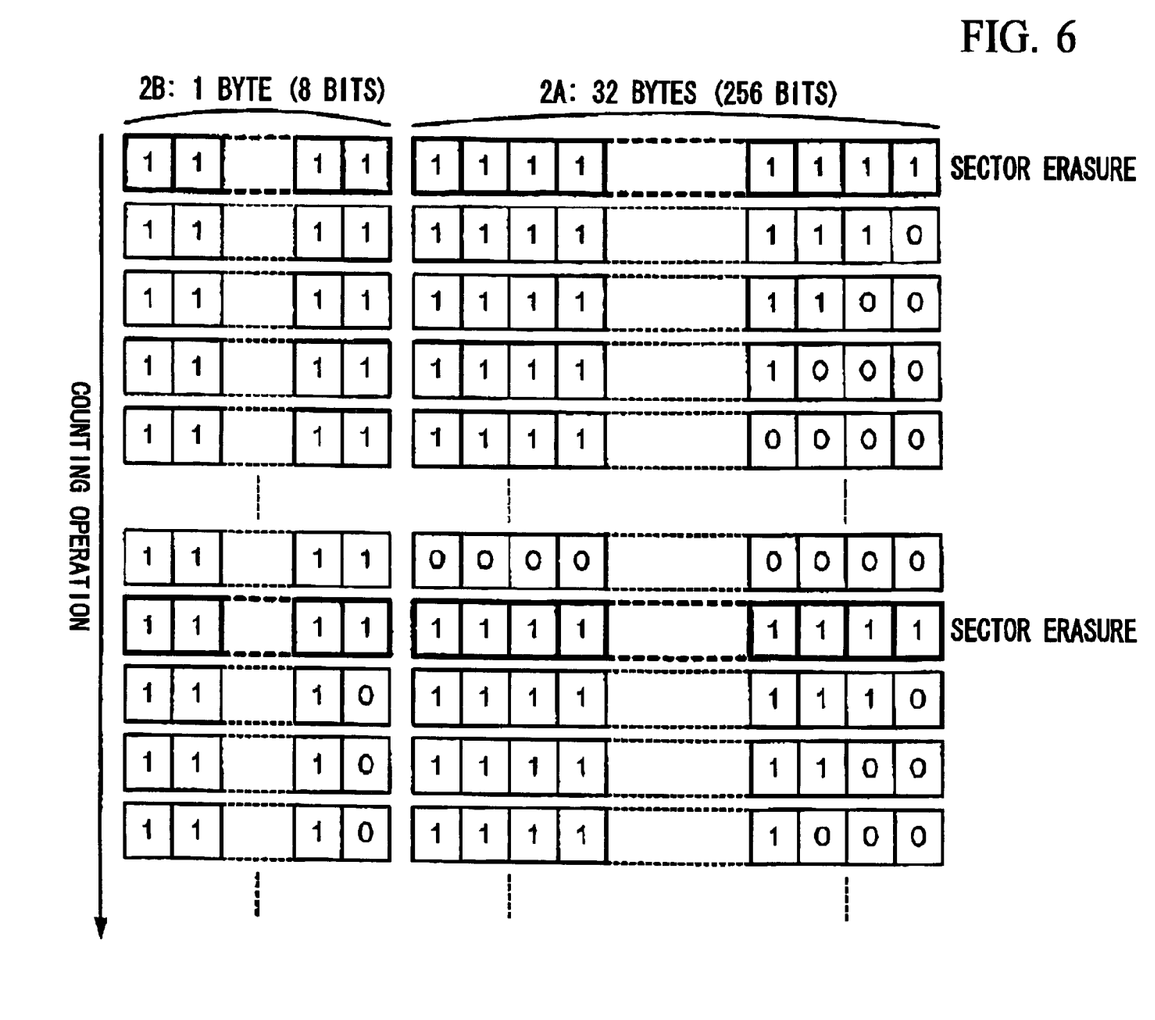
FIG. 6 is a schematic diagram showing the frequency of sector erasures in the counter device according to the second embodiment.

Here, FIG. 6 is a schematic diagram showing the frequency of sector erasures in the counter device according to the second embodiment. As described above, in the flash memory 1, when the bit is turned from OFF to ON (from bit "0" to bit "1"), sector erasure is generated. That is, in the second embodiment, as shown in FIG. 6, each time the lower counter 2a is reset, that is, once per 256 times, sector erasure is generated (as shown box part with bold line in FIG. 6). Moreover, in the second embodiment, since counting is not performed by bit units, then assuming that the bit number of the lower counter 2a is "n", and the bit number of the upper counter 2b is "m", only multiplying $2^m$ and "n" need be counted, and the counting can be performed with a full guaranteed number of writings in the flash memory, with a small memory capacity.

According to the second embodiment, the device load can be reduced, and the reliability of the counter value can be increased, without increasing the memory capacity nor the cost. That is, by a simple modification of software, the device load can be suppressed by half, and the reliability of the counter value can be increased.

In the above first embodiment and second embodiment, the control section 3 is executed within the computer system. The process of a series of processing by the control section 3 is stored in a computer readable recording medium, in the form of a program. A computer reads out and executes the program, to thereby perform the above processing. That is, the respective processing devices and the processing sections in the control section 3 are executed by having a central processing unit such as a CPU read out the program into a main storage device such as ROM or RAM, and execute the information arithmetic processing.

Here, computer readable recording medium means a magnetic disk, a magneto-optical disk, a CD-ROM, a DVD-ROM, a semiconductor memory, and the like. Moreover, the configuration may be such that the computer program is delivered to a computer through communication lines, and the computer that receives the delivery executes the program.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A counter device comprising:
a rewritable counter having a non-volatile memory which requires sector erasure to once turn all data in a sector into high data, prior to changing low data into high data in respective bits; and
a control section updating a counter value of the rewritable counter by writing in and reading out the data with respect to the rewritable counter using a complement of 1, and thereby controlling writing in and reading out the data of the rewritable counter.

2. A counting method comprising:
controlling writing in and reading out the data of a rewritable counter having a non-volatile memory which requires sector erasure to once turn all data in a sector into high data, prior to changing low data into high data in respective bits; and
updating a counter value of the rewritable counter by writing in and reading out of the data with respect to the rewritable counter using a complement of 1.

* * * * *